ously adding $(2^M-1-m)$
United States Patent
Nakayama

[11] 4,255,794
[45] Mar. 10, 1981

[54] DIGITAL FILTER

[75] Inventor: Kenji Nakayama, Tokyo, Japan

[73] Assignee: Nippon Electric Co., Ltd., Japan

[21] Appl. No.: 37,278

[22] Filed: May 9, 1979

[30] Foreign Application Priority Data

May 10, 1978 [JP] Japan .................................. 53-55335
Aug. 16, 1978 [JP] Japan ............................... 53-100313

[51] Int. Cl.³ ............................................ G06F 15/31
[52] U.S. Cl. ................................................. 364/724
[58] Field of Search ........................................ 364/724

[56] References Cited

U.S. PATENT DOCUMENTS

| | | | |
|---|---|---|---|
| 3,777,130 | 12/1973 | Croisier et al. | 364/724 |
| 3,988,606 | 10/1976 | Eggermont | 364/724 |
| 4,125,900 | 11/1978 | Betts | 364/724 |

*Primary Examiner*—Jerry Smith
*Attorney, Agent, or Firm*—Charles W. Helzer

[57] ABSTRACT

The digital filter which performs a filter mathematical operation on 2N samples Zi expressed by binary codes in which an output sample y(n) of said filter is expressed by the following equation:

$$y(n) = \sum_{i=0}^{2N-1} A_i Z_i = \sum_{i=0}^{2N-1} \left\{ \sum_{j=1}^{K} a_{ij} 2^{Mo-jM} \right\} Z_i^*$$

$$= \sum_{l=0}^{2^M-1} \left\{ \sum_{j=1}^{K} S_{jl} \cdot 2^{Mo-jM} \right\} l$$

$$= \sum_{l=0}^{2^M-1} S_l \cdot l = \sum_{m=1}^{2^M-1} \tilde{S}_m$$

where magnitude of $$A_i = \sum_{j=1}^{K} a_{ij} \cdot 2^{Mo-jM}, Z_i^*$$

represents a product of a sign of Ai and Zi, $S_{jl}$ represents a total sum of Zi* corresponding to $$a_{ij} = l, (i = 0, 1 - - 2N - 1) \; S_l = \sum_{j=1}^{K} S_{jl} \cdot 2^{Mo-jM}, \text{ and }$$

$$\tilde{S}_m = \sum_{l=m}^{2^M-1} S_l.$$

The digital filter comprises, a first memory device for storing continuous 2N sample values, a second memory device for storing partial coefficients aij (j<k) which are obtained by dividing each coefficient Ai with k and sign of Ai, a first device for determining a total sum Sjl of sample values stored in the first memory device and relating to l=aij of a partial coefficient aij read out from the second memory device, a shifter for shifting an output Sj of the first device by $2^{Mo-jM}$ (Mo and M are positive integers) a second device for cummulatively adding k times an output $2^{Mo-jM}$. Sj of the shifter to obtain $$\sum_{j=1}^{K} S_{jl} \cdot 2^{Mo-jM} = S_l,$$

a third device for cummulatively adding $(2^M-1-m)$ times the output of the second device to obtain $$\sum_{l=m}^{2^M-1} S_l = \tilde{S}_m$$

and a fourth device for cummulatively adding $(2^M-2)$ times an output of the third device to obtain an output y(n) of the filter.

12 Claims, 8 Drawing Figures

FIG. 7A

| COEFFICIENT | | AREA 2 | AREA 1 | | AREA 3 |
|---|---|---|---|---|---|
| | | SIGN BIT | SECOND PARTIAL COEFFICIENT | FIRST PARTIAL COEFFICIENT | |
| $a_0$ | $A_1$ | 0 | 1 | 1 | 0 0 1 0 0 1 1 1 |
| $a_1$ | $A_2$ | 1 | 0 | 1 | 0 0 0 1 0 1 1 1 |
| $a_2$ | $A_3$ | 1 | 1 | 0 | 1 1 0 0 1 0 0 1 |
| $a_3$ | $A_4$ | 0 | 1 | 0 | 1 1 1 0 1 0 0 1 |
| $a_4$ | $A_5$ | 0 | 1 | 0 | 0 0 1 0 1 1 |

FIG. 7B

| SAMPLE | | ADDRESS | AREA |
|---|---|---|---|
| $Z_1$ | $x(n)$ | 1 | 1 |
| $Z_2$ | $x(n-1)$ | 2 | |
| $Z_3$ | $x(n-2)$ | 3 | |
| $Z_4$ | $y(n-1)$ | 4 | 2 |
| $Z_5$ | $y(n-2)$ | 5 | |

DIGITAL FILTER

BACKGROUND OF THE INVENTION

This invention relates to a digital filter, and more particularly a digital filter which performs mathematical operations by using a read only memory device and a random access memory device.

A digital filter functions to digitally operate a binary coded sample signal which is obtained by sampling and quantizing an analogue signal so as to impart a desired filter characteristic to the signal. Such digital filter is widely used in various signal processing apparatus including modulation/demodulation devices (MODEM). Generally, the digital filter is constituted by such digital elements that can be formed into an integrated circuit as a shift register, a multiplier and an adder, and has better frequency response characteristics than an analogue filter.

In addition, it has such advantages that it can be manufactured to have a small size and that it is economical. However, the digital filter must use many multipliers so that its price is higher than it otherwise might be.

For this reason, a digital filter has been proposed which uses a read only memory device (ROM) instead of multipliers. Such digital filter is disclosed, for example, in U.S. Pat. No. 3,777,130 by Cloisier et al on Dec. 4, 1973, especially in FIG. 2. When the digital filter disclosed in this patent is applied to an automatic equalizing circuit of MODEM, the size of the ROM for storing a partial product $$Si = \sum_{j=1}^{N} \alpha i \cdot Z^j$$

of a filter coefficient $\alpha i$ and a signal subset $Z^j$ obtained from an input sample increase which is not advantageous.

SUMMARY OF THE INVENTION

Accordingly, it is a principal object of this invention to provide an improved digital filter having simpler and smaller construction than a prior art digital filter utilizing a ROM.

To accomplish this object, the invention is based on the fact that when a filter operation is performed on 2N sample values Zi expressed by continuous binary codes, the output sample value y(n) is expressed by the following equation $$y(n) = \sum_{i=0}^{2N-1} Ai \cdot Zi$$

where Ai represents various weighting factors or coefficients obtainable from a pulse response or a filter transfer function.

By modifying the aove described equation we obtain $$y(n) = \sum_{i=0}^{2N-1} Ai \cdot Zi = \sum_{i=0}^{2N-1} \{ \sum_{j=1}^{k} aij 2^{Mo-jM} \} Zi^*$$
$$= \sum_{l=0}^{2^M-1} \{ \sum_{j=1}^{K} S_{jl} \cdot 2^{Mo-jM} \} l$$

where $$Ai = \sum_{j=1}^{k} aij \cdot 2^{Mo-jM}$$

aij: partial coefficient obtained by dividing Ai with k (positive integer)
Zi*: product of the sign of Ai and Zi.
$S_{jl}$: total sum of Zi corresponding to aij=1

According to this invention, there is provided a digital filter comprising a first memory device for storing continuous 2N sample values;

a second memory device for storing partial coefficients aij (j<k) which are obtained by dividing a coefficient Ai with k and sign of Ai;

first means for determining a total sum $S_{jl}$ of sample values stored in the first memory device and relating to l=aij of a partial coefficient aij read out from the second memory device;

shifter means for shifting an output $S_{jl}$ of the first means by $2^{Mo-jM}$ (Mo and M are positive integers);

second means for cumulatively adding k times the output $2^{Mo-jM} S_{jl}$ of the shifter means to obtain $$\sum_{j=1}^{k} S_{jl} \cdot 2^{Mo-jM} = S_l;$$

third means for cumulatively adding $(2^M-1-m)$ times the output of the second means to obtain $$\sum_{l=m}^{2^M-1} S_l = \widetilde{Sm},$$

and fourth means for cumulatively adding $(2^M-2)$ times the output $\widetilde{Sm}$ of the third means to obtain the output y(n) of the filter.

BRIEF DESCRIPTION OF THE DRAWINGS

In the accompany drawings:

FIG. 7A is a table showing one example of the filter coefficient utilized to explain the operation of the digital filter shown in FIG. 2, and FIG. 7B is a table showing one example of the sample value utilized to explain the operation of the digital filter shown in FIG. 2.

DESCRIPTION OF THE PREFERRED EMBODIMENTS

Figure 1:
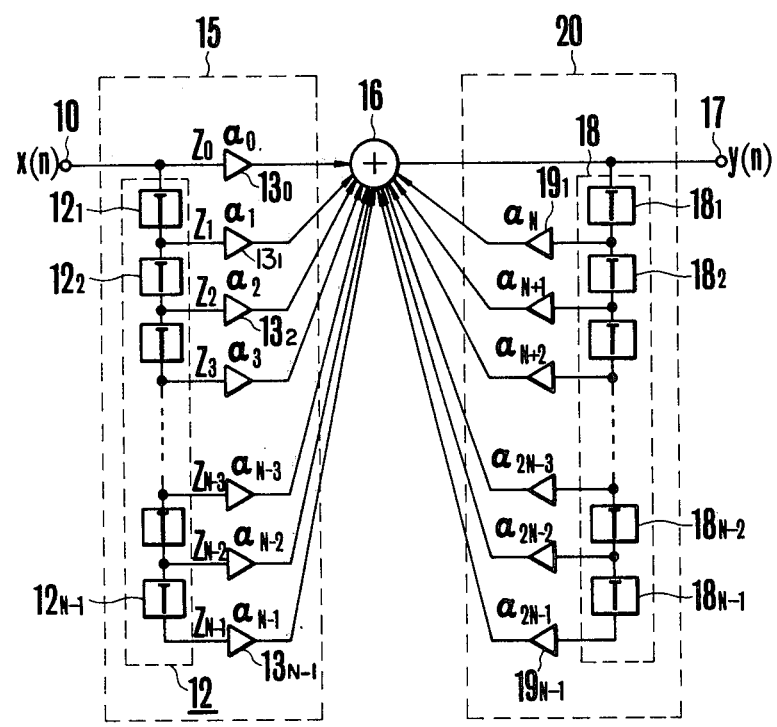
FIG. 1 is a block diagram showing the basic construction of a digital filter.

FIG. 1 shows the basic construction of a digital filter on which the invention is based. An input terminal 10 is supplied with a display sample signal $x(n)=Z_0$ in the form of a binary code obtained by sampling an analogue signal at a frequency Fs and then quantitizing the sampled signal. This input signal is applied to a first delay device 12 constitued by cascade connected N delay elements $12_1$ through $12_{N-1}$ and having a delay time T equal to the sampling period 1Fs and to a multiplier $13_0$ having a multiplier coefficient $\alpha_0$. The outputs $Z_1 \sim Z_{N-1}$ of respective delay elements $12_1 \sim 12_{N-1}$ are applied to respective multipliers $13_1 \sim 13_{N-1}$, each having a multiplier coefficient $\alpha i$ ($i=1 \sim N-1$). The coefficients of these multipliers are derived out from a desired impulse response or a frequency transfer function. The various circuit elements described above constitute a forward unit 15. The outputs of the multipliers $13_0 \sim 13_{N-1}$ are sent to an adder 16 to add together the results of multiplying operations, and the result of addition is sent out from an ouptut terminal 17 as an output y(n) and is applied to a second delay device 18 comprising cascade connected N delay elements $18_1 \sim 18_{N-1}$. The outputs of these delay elements are respectively applied to multipliers $19_1 \sim 19_{N-1}$ having a weighting multiplier coefficient $\alpha i$ ($i=N \sim 2N-1$) and the outputs of these multipliers are applied to the adder 16 described above. The delay device 18 and the multipliers $19_1 \sim 19_{N-1}$ constitute a feedback unit 20.

with the construction, it is possible to produce an output sample value having a desired filter characteristic by varying the coefficient $\alpha i$.

How to derive out the operation equations of the filter of this invention which is equivalent to the filter operation of the circuit shown in FIG. 1 will be discussed hereunder. As disclosed in U.S. Pat. No. 3,777,130 the difference equation representing the filter operation in the time domain of the filter shown in FIG. 1 is as follows.

$$y(n) = \sum_{i=0}^{2N-1} Ai \cdot Zi \qquad (1)$$

where $2N-1$ represents the number of weighting taps of the delay devices 12 and 18, Ai corresponds to the weighting coefficient $\alpha_0 \sim \alpha_{2-1}$ derived from the impulse response or the transfer function of the filter described above, and Zi represents sample value read out from the input and respective delay elements. Generally, among binary code representations may be mentioned a sign-magnitude representation and a 2's complement representation. It is assumed herein that the coefficient Ai is represented by sign-magnitude representation, while the sample value representation Zi is represented by the 2's complement representation. Regarding the detail of these representations, reference may be had to pages 10~15 of a text book "Digital Computer Design Fundamentals", published by McGraw-Hill Book Co. Inc.

Denoting the product of the sign of the coefficient Ai and the sample value Zi by Zi*, equation (1) is modified as follows $$y(n) = \sum_{i=0}^{2N-1} |Ai| \cdot Zi^* \qquad (2)$$

Denoting the number of bits of the absolute value $|Ai|$ of the coefficient Ai by LA, and dividing LA into k groups of partial bits each including M bits ($LA = k \cdot M$) and denoting the jth ($k > j$) group of the absolute value $|Ai|$ by a partial coefficient, the magnitude of Ai can be expressed by the following equation $$|Ai| = \sum_{j=1}^{k} aij \cdot 2^{Mo-jM} \qquad (3)$$

where $2^{-jM}$ and $2^{Mo}$ show that aij is shifted by $-M$ bits and Mo bits respectively, and Mo and M are positive integers.

By substituting equation (3) into equation (2), equation (4) is obtained.

$$y(n) = \sum_{i=0}^{2N-1} (\sum_{j=1}^{k} aij \cdot 2^{Mo-jM}) Zi^* \qquad (4)$$

$$= \sum_{j=1}^{k} \{\sum_{i=0}^{2N-1} (aij \cdot Zi^*) 2^{Mo-jM}\}$$

By denoting the sum $Zi^*$ (among 2N sample values $Zi^*$) whose partial coefficient aij is equal to 1 (an integer between 0 and $2^M - 1$) by $S_{jl}$, equation (4) can be shown as follows.

$$y(n) = \sum_{j=1}^{K} \{\sum_{l=0}^{2^M-1} S_j \cdot l\} 2^{Mo-jM} \qquad (5)$$

$$= \sum_{l=0}^{2^M-1} \{\sum_{j=1}^{k} S_j \cdot 2^{Mo-jM}\} l$$

By putting $$\sum_{j=1}^{k} S_{jl} \cdot 2^{Mo-jM} = S_l \qquad (6)$$

equation (5) is modified as follows $$y(n) = \sum_{l=0}^{2^M-1} S_l \cdot l \qquad (7)$$

Putting $$\widetilde{Sm} = \sum_{l=m}^{2^M-1} S_l \qquad (8)$$

where $m = 1, 2, \ldots 2^{m-1}$
since $\widetilde{Sm} = Sm + 1 + Sm$, equation (7) can be modified as follows $$y(n) = \sum_{m=1}^{2^M-1} \widetilde{Sm} \qquad (9)$$

The operational equation (1) representing the sum of the products of the coefficients Ai and the sample values Zi can be derived out from equations (6), (8) and (9) by addition and shifting operations. In other words, no multiplying operations are required. The apparatus of this invention is based on these euqations (6), (8) and (9).

Figure 2:
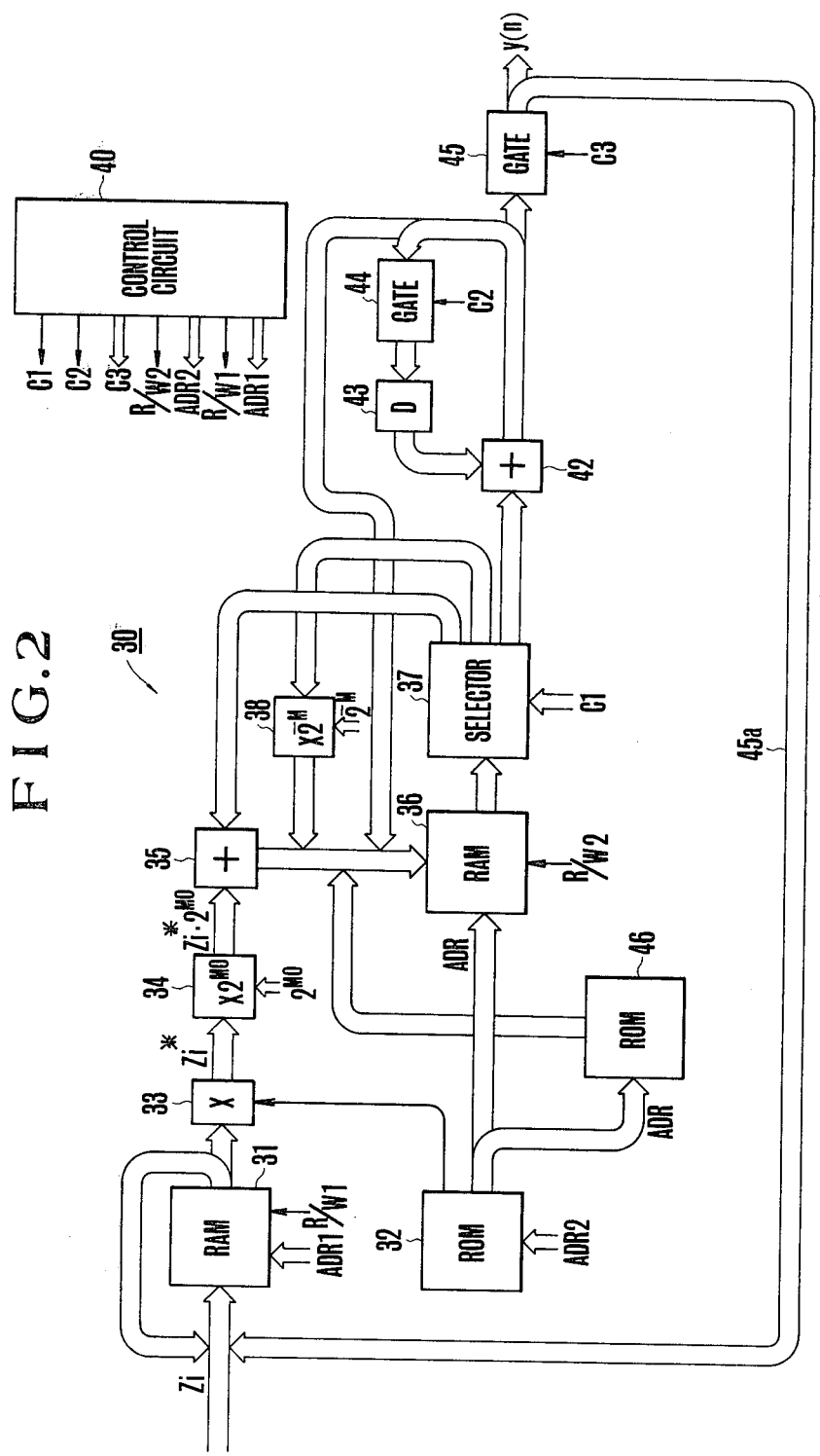
FIG. 2 is a block diagram showing one embodiment of a digital filter according to this invention.

FIG. 2 illustrates one example of the digital filter of this invention executing filter mathematical operations expressed by equations (6)~(9) described above through the use of selectively executed addition and shifting operations. The digital filter 30 shown in FIG. 2 comprises a random access memory device (RAM) 31, a read only memory device ROM 32, operational circuits 33 and 34, an adder 35, a RAM 36, a selector 37 and an operational circuit 38 which are provided for executing the mathematical operation of equation (6). More particularly, RAM 31 comprises a first memory area which store a plurality of binary coded display sample input values Zi obtained by sampling an analogue signal at a frequency of Fs and then quantitizing the sampled signal, and a second memory area which stores a plurality of output sample values which have been subjected to filter mathematical operation. Writing of these sample values Zi in RAM 31 is effected by an address signal ADR1 and a read and write control signal R/W1 which are supplied from a control circuit 40. The ROM 32 has a first memory area which stores partial coefficients aij by dividing the coefficient Ai with k, a second memory area which stores the sign bits of the coefficient Ai, and a third memory area which stores the read out address, for rewriting the content of the RAM 36 which has been subjected to a predetermined processing in the RAM 36. Reading out of these partial coefficients aij, sign bits and wire and read address signals is performed by an address signal ADR2 generated by the control circuit 40.

The first operational circuit 34 is used to obtain a product $Zi^* \cdot 2^{Mo}$ of the outputs $Zi^*$ and $2^{Mo}$ from the operational circiut 33. The adder 35 is used to add the output $2^{Mo} \cdot Zi^*$ of the operational circuit 34 and a partial sum stored in an address of the RAM 36 represented by a partial coefficient aij read out from the ROM 32, and the output of the adder 35 is applied to RAM 36. This RAM 36 has $2^M$ addresses addressable with the M bit partial coefficient, and its read and write operations are performed by a read/write control signal R/W2 supplied from the control circuit 40. The third operational circuit 38 multiplies the output from RAM 36 with $2^{-M}$ and applies its output to RAM 36. In response to a control signal C1 supplied from the control circuit 40, the selector 37 selectively supplies the output of RAM 36 to adder 35, the second adder 42 and the third adder 38.

The circuit for obtaining equations (7) and (8) will now described. This circuit is constituted by ROM 32, RAM 36, adder 42, delay circuit 43 and selector 37. More particularly, adder 42 calculates a sum of the output of ram 36 read out therefrom by an address signal from ROM 32, and the output of the delay circuit 43 which functions to delay one block the output of the adder 42 and to supply again the delayed outputto adder 42. In response to a control signal C2 from the control circuit 40, a gate circuit 44 applies a "0" signal to the delay circuit 43 for clearing the same, but under normal state, the gate circuit 44 applies the output of the adder 42 to delay circuit 43. In response to a control signal C3 supplied from the control circuit 40, a gate circuit 45 produces an operated output y(n) which is fed back to the input of RAM 31 via a path 45a. In response to an address signal which is produced by ROM 32 for the purpose of obtaining a next operated output y(n+1), the ROM 46 produces a "0" output for clearing RAM 36.

The construction and operation of the operational circuits 33, 34 and 38 will now be described in detail wherein it is assumed that the input/output sample value Zi has a word length of 5 bits.

Figure 3:
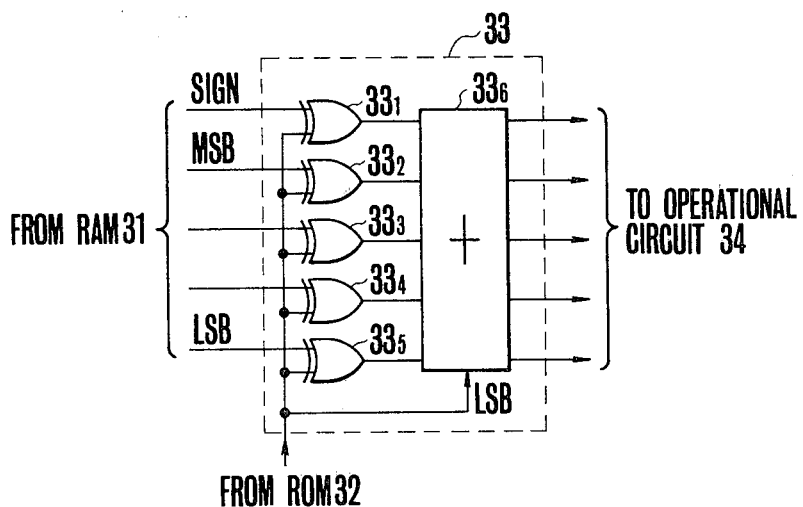
FIGS. 3, 4 and 5 are connected diagrams showing concrete examples of the first to third operation circuit shown in FIG. 2.

The first operational circuit 33 has a construction as shown in FIG. 3. More particularly, it comprises exclusive OR gate circuits (EXOR) $33_1 \sim 33_5$ which determine the exclusive logical sum of the respective bits of the sample value Zi produced by RAM 31 and the sign bits produced by ROM 32, and an adder $33_6$ which calculates the sum of the output of an exclusive OR gate circuit $33_5$ connected to the least significant bit (LSB) of the sample value Zi, and the sign bit. With this construction, it is possible to determine the product of a sample value presented by 2's complement and a sign bit of the coefficient. For example where the product of a sample value 11.010 (−0.75 . . . . a decimal representation) and a sign bit 1 (negative) is determined, the outputs of the exclusive OR gate circuits $33_1 \sim 33_5$ would be "00.101", when "1" is added to its LSB by adder $33_6$ it will produce an output "00.110" (positive 0.75).

Figure 4:
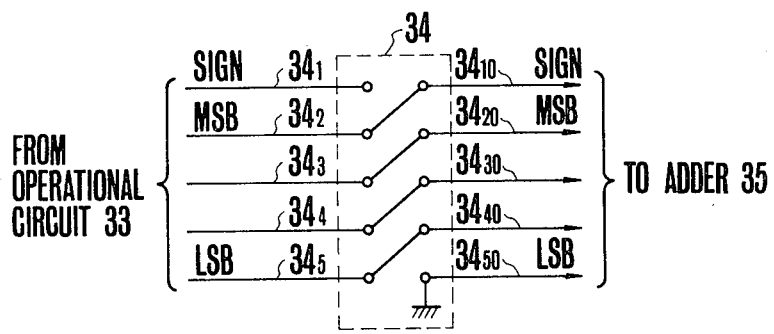
Figure 5:
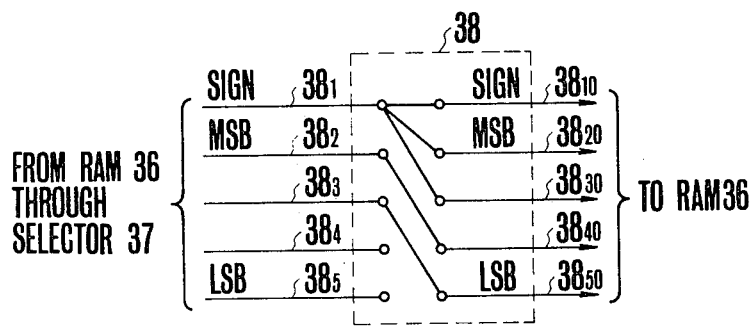

FIGS. 4 and 5 show examples of the second and third operational circuits 34 and 38 shown in FIG. 2. Thus, the operational circuit 34 shown in FIG. 4 performs the multiplying operation of $2^{Mo}$ and $Zi^*$ shown in equation (4). Assuming that Mo=1, this can be accomplished by connecting a significant bit line $34_2$, among the output lines fo the operational circuit 33, that is the input lines $34_1 \sim 34_5$ to the operational circuit 34, to a sign bit line $34_{10}$ among output lines $34_{10} \sim 34_{50}$, that is the input lines to the adder 35, thus connecting the input lines $34_3 \sim 34_5$ to output lines $34_{20} \sim 34_{40}$ which are obtained by shifting one bit the input lines toward the most significant bits of corresponding output lines $34_{30} \sim 34_{50}$. At this time the output line $34_{50}$ is applied with a "0" signal, that is a ground signal.

The operational circuit 38 shown in FIG. 5 functions to multiply $2^{-M}$ shown in equation (3) with the output of the RAM 36. Assuming now that M=2, this can be accomplished by connecting a sign bit line $38_1$ among the output lines of selector 37, that is the input lines $38_1 \sim 38_5$ to the operational circuit 38 to output lines $38_{10}$, $38_{20}$ and $38_{30}$ among the output lines $38_{10} \sim 38_{50}$ of the operational circuit 38, that is the input lines to RAM 36 and by connecting the input lines $38_1 \sim 38_3$ to output lines $38_{30} \sim 38_{50}$ which are shifted two bits from corresponding output lines $38_{10} \sim 38_{50}$ toward the least significant bit. As above described an operational circuit which multiplies by power of 2 can be provided by changing the connection of signal lines.

Figure 6:
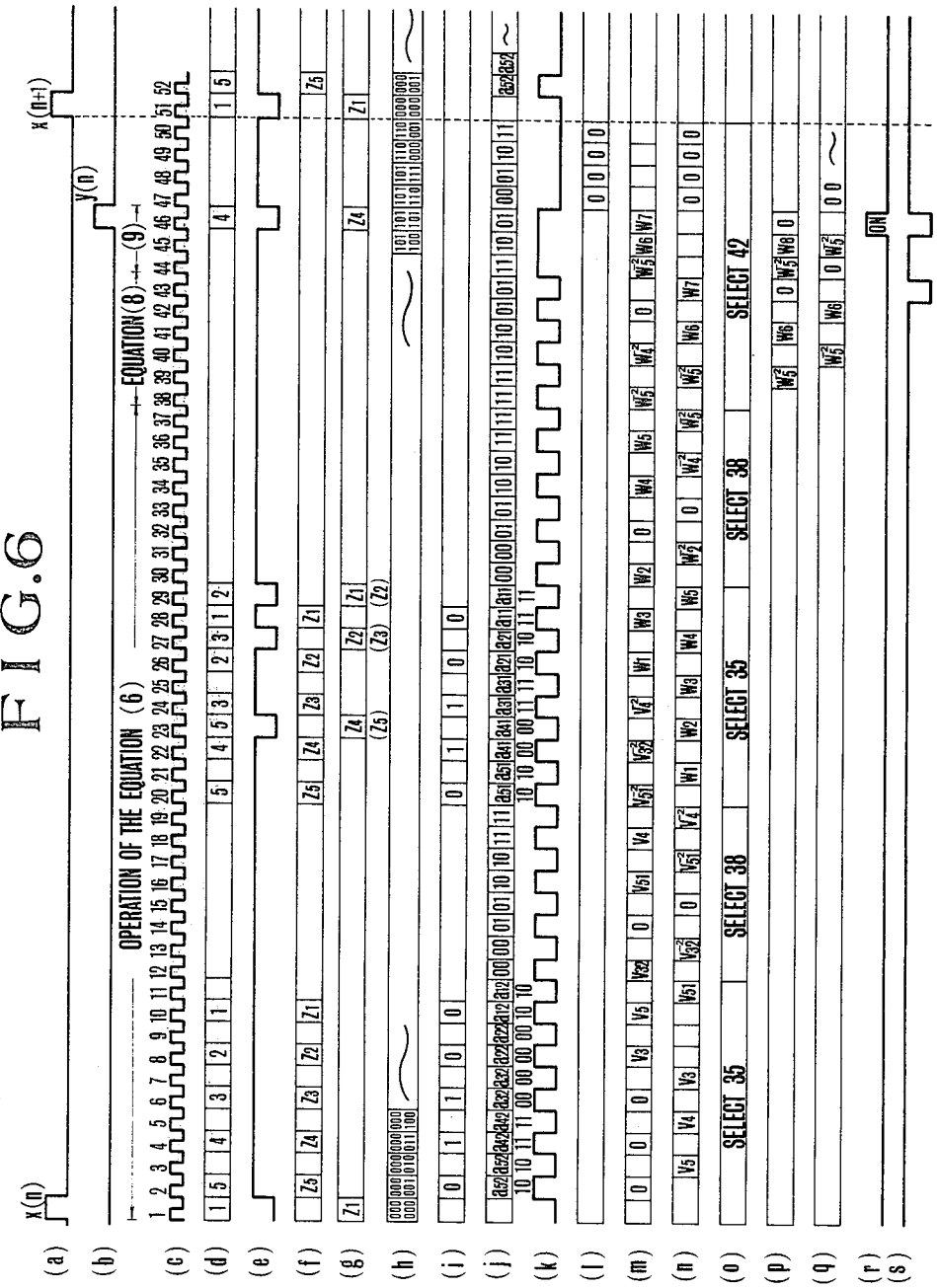
FIGS. 6a thru 6s are time charts useful to explain the operation of the digital filter shown in FIG. 2.

FIGS. 6a~6s show a time chart useful to explain the operation of the circuit of this invention, while FIGS. 7A and 7B are tables showing examples of the coefficient Ai and the sample value Zi derived out from the terminal of the delay devices 12 and 18 shown in FIG. 1. The operation of the embodiment of this invention shown in FIG. 2 will now be described in detail with reference to FIGS. 7A and 7B. In this example, the operation of a secondary recursive type filter will be described. Thus the number of Ai is 5.

Further, it is assumed herein that the number of bits of the absolute value |Ai| of the coefficient Ai is 4, that the number of division L of the coefficient is 2 and that the word length of the sample value Zi is 5 bits. Consequently, the number of bits M of the partial coefficient aij is two.

The mathematical operation of equation (8) will firstly be described.

At clock 1 of the clock output of the control circuit 40 shown in FIG. 6c, the sample value Z1 (FIG. 6g) of x(n) which are applied with the sample period shown in FIG. 6a is written in address 1 (FIG. 7B) of the memory area 1 of RAM 31 shown in FIG. 2 by an address designation signal ADR1 (FIG. 6d) from the control circuit 40 and a writing designation signal R/W1 (at low level) shown in FIG. 6e.

At clock 2, the output sample value Z5 (FIG. 6f) two sample periods before the sample value Z1, is read out from address 5 in the memory area 2 of RAM 31 by an address signal (FIG. 6d) and a read out signal (at a high level as shown in FIG. 6e), and the sample value Z5 is supplied to the operational circuit 33. At this time, the operational circuit 33 is supplied with the sign bit "0" (positive) (FIG. 6i) of coefficient A5 (FIG. 7A) read out from the memory area 2 of ROM 32 by the read out address designation signal ADR2 (FIG. 6h) so that the operational circuit 33 operates to obtain the product of the sign bit "0" and the sample value Z5. After being multiplied with $2^{Mo}$ by the operational circuit 34, this product is applied to the adder 35 as $V5=Z5^* \cdot 2^{Mo}$. At clock 2, the first partial coefficient a52 (FIG. 7A) of the coefficient that is "10" (FIG. 6j) is read out from the memory area 1 of ROM 32 and applied to RAM 36 as an address signal ADR. Since "0" is stored in address "10" in RAM 36 as the initial value, the read out signal R/W2 (at a high level as shown by FIG. 6k) read out "0" (FIG. 6m) stored in address "10" of RAM 36 and it is sent to selector 37. At this time, since selector 37 has selected the output of adder 35 in response to a control signal shown by FIG. 6o, the output "0" of RAM 36 is given to adder 35.

At clock 3, the adder 35 adds the output of the operational circuit 34 to the output "0" from RAM 36. The output of adder 35 (FIG. 6n) is written in address "10" of RAM 36 designated by a partial coefficient a52="10" (FIG. 7A) by a write signal R/W2 (at a low level as shown in FIG. 6k).

Then, at clock 4, a sample value Z4 (FIG. 7B) is read out from RAM 31. This sample value Z4 is multiplied with a sign bit "1" (negative) (FIG. 7A, and FIG. 6i) of the coefficient A4 read out from the memory area 2 of ROM 32 by the operational circuit 33, and this product $-Z4^*$ is supplied to the operational circuit 34 where it is multiplied with $2^{Mo}$ to produce an output $-Z4^* \cdot 2^{Mo} = V4$ (FIG. 6n). At this time, in response to a partial coefficient a42="11" (FIG. 7A) of the coefficient A4 read out from the memory area 1 of ROM 32 and acting as an address designation signal, the RAM 36 sends the content "0" (initial value) of address "11" to adder 35.

At clock 5, the output "0" of RAM 36 is added to the output V4 of the operational circuit 34, and the result of addition V4 (FIG. 6n) is written in address "11" of RAM 36.

At clocks 6 and 7, sample Z3 is mathematically operated in the same manner as above described, and the result of operation V3 (FIG. 6n) is stored in address "00" RAM 36, which represents the partial coefficient a32="00" (FIG. 7A) of a coefficient A3 corresponding to sample value Z3.

Then, at clock 8, since the partial coefficient a22="00" of coefficient A2 of sample value Z2 is the same as the partial coefficient a32 that is "00", V3 stored in address "00" of RAM 36 is read out and applied to adder 35. On the other hand, adder 35 adds the product of sample value Z2 and a sign bit "0" (positive) to $2^{Mo}$ to obtain V2.

At clock 9, the sum of V2' and V3, where $V32=V2+V3$ is stored in address "00" of RAM 36.

At clock 10, since the partial coefficient a12 (FIG. 7A) of coefficient A1 of sample value Z1 is the same as the partial coefficient a52, that is "10", V5 stored in address "10" of RAM 36 is read out and applied to adder 35 which is also supplied with a signal V1 obtained by processing sample value Z1.

At clock 11, V5 and V1 are added together and the result of addition V51 (FIG. 6n)=V5+V1 is stored in address "10". In this manner, a value $S_{2l}\cdot 2^{Mo}$ can be determined by utilizing sample values Z5~Z1.

At clocks 12~19, the selector 17 selects the operational circuit 38. During this interval, the contents V5, V4 . . . stored in addresses "00"~"11" of the RAM 36 are read out by the read/write signal (FIG. 6j) supplied from the memory area 3 of ROM 32 and then supplied to the operation circuit 38 which multiplies the read out contents V5, V4 . . . with $2^{-2}$ to write the results of multiplication $V5^{-2}$, $V4^{-2}$ . . . in the RAM 36 thereby determining $S_{2l}\cdot 2^{Mo} \cdot 2^{-2}$. During this interval (clocks 12~19) the reading out operation of RAM 31 is stopped.

At clocks 20~29, the contents $V32^{-2}$, $V51^{-2}$ . . . stored in RAM 36 are added with V5, V4, V3, V2, V1, that is the operated results of respective sample values Z5~Z1 and the sums are stored in addresses a51~all, respectively. As can be noted from the table, since the partial coefficients are decimal values, 2, 0, 3, 2, 3, the sums V5 and V2 are added to the content $V51^{-2}$ in address 2, the sums V3 and V1 is added to the content $V4^{-2}$ in address 3, whereas the sum V4 is added to the content $V32^{-2}$ in address 2, thus determining $S_{2l} \cdot 2^{Mo}$.

During this interval, the oldest sample values Z5 and Z3 among sample values Z1~Z5 which have been read out for receiving next samples $x(n+1)$ and $y(n)$ are discarded, and remaining sample values Z4, Z2 and Z1 are written in addresses 5, 3 and 2, one address advanced. At clocks 30~37, in the same manner as an interval of clocks 11~19, (interval 2), the content $(S_{2l}\cdot 2^{Mo} \cdot 2^{-2} + S_{1l}\cdot 2^{Mo})$ of RAM 36 is read out, multiplied with $2^{-M}$ and then written again in the RAM 36. By the processing described above the term $S_l$ in equation (6) is determined.

Among symbols shown in FIGS. 6m and 6n, V1~V5 represent the products of Z1~Z5 and the sign of the coefficients. V32, V51, W1, W2, W3, W4 and W5 respectively represent V3+V2, V5+V1, $V5+V51^{-2}$, $V4+V32^{-2}$, $V3+V4^{-2}$, V2+W1 and V1+W32. The coefficient $-2$ at the upper right shoulder of respective symbols means multiplication with $2^{-2}$.

The mathematical operation of equation (8) is as follows.

At clocks 38~43, the selector 37 selects the second adder 42. During this interval (clocks 38~43) the contents of read/write addresses "11"~"00" (FIG. 6j) are read out and sequentially applied to the RAM 36.

At clock 38, in response to the address designation signal "11" (FIG. 6j) from ROM 32, the RAM 36 sends the sample value $W5^{-2}$ (FIG. 6m) of address "11" to adder 42 which adds this sample value $W5^{-2}$ to the output "0" (initial value) from the delay circuit 43. At clock 39, the result of addition (FIG. 6p) is written in address "11" and is also applied to the delay circuit 43 via gate circuit 44.

At clock 40 since adder 42 is supplied with the sample value $W4^{-2}$ in the address "10" of RAM 36, it adds the sample value $W4^{-2}$ to the result of addition $W5^{-2}$ (FIG. 6q) from the delay circuit 43 at clock 39. The result of addition $W6=W5^{-2}+W4^{-2}$ is written in the address "10" of RAM 36 at clock 41, and also supplied to the delay circuit 43. In this manner, during an interval between clocks 38~43, the term $\overline{Sm}$ of equation (8) can be determined.

At clock 43, the gate circuit 44 is closed by a control signal C2 (FIG. 6s) thus storing "0" (FIG. 6p) in the delay circuit 43. This is done for performing an accumulative addition of $\overline{Sm}$ as will be described later.

The mathematical operation of equation (9) will now be described.

At clock 44, in response to a read/write signal read out from the memory area 3 of ROM 32, the content $W5^{-2}$ in the address "11" of RAM 36 is sent to the adder 42 which adds together the output "0" (initial value) of the delay circuit 43 and the output $W5^{-2}$ of RAM 36 and applies the sum to delay circuit 43.

At clock 45, the adder 42 adds a signal W6 read out from address "10" of RAM 36 to the output $W5^{-2}$ of the delay circuit 43. As above described, at clocks 44~46, by sequentially adding with the adder 42 outputs $W5^{-2}$, W6 and W7 stored in addresses "11"~"01" of RAM 36, the calculated output y(n) (FIG. 6b) of equation 9 can be determined. At this time, since the gate circuit 45 is enabled by a control signal C3 (FIG. 6r) this output y(n) is applied not only to an output terminal (not shown) but also to address 4 (FIG. 6d) of RAM 31 via a line 45a to act as an output sample to determine the next operated output y(n+1). At clock 46, a "0" is stored in the delay circuit 43 by disenabling the gate circuit 44 in preparation for the next filter mathematical operation.

Then, at clock 50, for the purpose of clearing the content of RAM 36 to prepare for the next filter mathematical operation, "0" (FIG. 6l) is written into RAM 36 from ROM 46 by a read/write signal (FIG. 6j) from control circuit 40. In this manner, the mathematical operation for an output 1 is performed.

Among symbols shown in FIGS. 6m and 6n at clocks 38~46, W6, W7 and W8 represent $Z4^{-2}+Z5^{-2}$, $Z6+0$, and $Z5^{-2}+Z6$, and "$-2$" at the upper right shoulder means multiplication of that symbol with $2^{-2}$.

As above described, according to this invention since the RAM 36 is utilized to determine $S_l$ of equation (6), Sm of equation (8) and y(n) of equation (9), it may be constituted by a memory device addressable with a M bit partial coefficient aij, whereby it is possible to greatly reduce the total capacity of the memory devices utilized in the digital filter including the ROM 32 for storing the coefficient in comparison to the memory capacity of a ROM addressed by an N bit (N>M) signal as disclosed in said U.S. Pat. No. 3,777,130. For instance, when the word length of the output sample of a 60th order filter is 20 bits, in a filter utilizing a ROM as disclosed in said U.S. Patent, where ten 6-bit address ROMs are used, a memory capacity of a total of $2^6 \times 10 \times 20 = 12,800$ bits is necessary. In contrast with this invention, assuming a coefficient of 12 bits and the number of division of the coefficient of 3, it is necessary to use a RAM 36 having a memory capacity of $2^4 \times 20 = 320$ bits and a ROM 32 having a memory capacity of $12 \times 60 = 720$ bits, that is a memory capacity of 1040 bits, thus greatly decreasing the memory capacity.

In the above described embodiment, the number of orders were taken as 2 and the number of divisions of the coefficient as 2, but as can be noted from the operational equations (6)~(9), the number of the orders and the number of divisions may be any other numbers, for example N and L (any integer) respectively. In this case, the first to Lth partial coefficients are stored in ROM 32, and in RAM 31 may be stored 2N−1 samples, that is N input samples of x(n)~x(n−N) input samples and (N−1) output samples of y(n−1)~y(n−N).

While in the foregoing embodiment, the coefficient was divided, it is also possible to divide an input/output sample. Furthermore although the coefficient was expressed by a sign magnitude, it is also possible to express it as 2's complement. Although the operation of a recursive type filter was described, a non-recursive type filter can be obtained where the feedback line 45a shown in FIG. 2 is eliminated.

What is claimed is:

1. A digital filter which performs a filter mathematical operation on input 2N sample values Zi expressed by binary codes in which an output sample y(n) of said filter is expressed by the following equation $$y(n) = \sum_{i=0}^{2N-1} Ai \cdot Zi = \sum_{i=0}^{2N-1} \left\{ \sum_{j=1}^{K} aij \cdot 2^{Mo-jM} \right\} Zi^*$$

$$= \sum_{l=0}^{2^M-1} \left\{ \sum_{j=1}^{K} S_{jl} \cdot 2^{Mo-jM} \right\} l$$

$$= \sum_{l=0}^{2^M-1} S_l \cdot l = \sum_{m=1}^{2^M-1} \widetilde{Sm}$$

where the magnitude of $$Ai = \sum_{j=1}^{K} aij \cdot 2^{Mo-jM}, Zi^*$$

represents a product of a sign of Ai and Zi, aij represents a partial coefficient obtained by dviding Ai with k, k is the number of groups of partial bits each including M bits, l is an integer between O and $2^M-1$, $S_{jl}$ represents a total sum of $Zi^*$ corresponding to $$aij = l \text{ for } (i = 0, 1, 2 \cdot 2N - 1),$$

$$S_l = \sum_{j=1}^{K} S_{jl} \cdot 2^{Mo-jM}, m = 1, 2, \ldots 2^{m-1},$$

$$\text{and } \widetilde{Sm} = \sum_{l=M}^{2^M-1} S_l,$$

said digital filter comprising:

first memory means responsive to a plurality of input sample values Zi for storing continuous 2N sample values;

second memory means for storing partial coefficients aij (j<k) which are obtained by dividing each coefficient Ai with K and sign of Ai;

first operational circuit means responsive to said first and second memory means for determining a total sum $S_{jl}$ of sample values Zi stored in said first memory means and relating to l=aij of a partial coefficient aij read out from said second memory means;

shifter means responsive to said first operational circuit means for effectively multiplying by shifting an output $S_{jl}$ of the first operational circuit means by $2^{Mo-jM}$ where Mo and M are positive integers;

first adder means responsive to an output from the shifter means for cumulatively adding k times an output $2^{Mo-jM} \cdot S_{jl}$ of the shifter means to obtain $$\sum_{j=1}^{K} S_{jl} \cdot 2^{Mo-jM} = S_l;$$

second adder means responsive to the results of said first adder means for cumulatively adding $(2^M - 1m)$ times the output of the first adder means to obtain $$\sum_{l=m}^{2^M-1} S_l = \widetilde{Sm}$$

and third adder means responsive to the results of said second adder means for cumulatively adding $(2^M - 2)$ times an output of said second adder means to obtain an output y(n) from said filter.

2. The digital filter according to claim 1 which further includes a feedback path which applies the output y(n) of said third adder means back to the input of said first memory means along with said sample values.

3. A digital filter according to claim 2 further including control circuit means operatively intercoupled with and controlling each of said first and second memory means and selector circuit means responsive to said control circuit means annd selectively controlling the sequence of operation of the first adder means, the second adder means and the third adder means to produce the output sample y(n).

4. A digital filter according to claim 2 further including third memory means responsive to the outputs of said first, second and third adder means respectively for sequentially receiving and temporarily storing the resultant outputs from each of said adder means and thereafter supplying a stored interim output to the next successive adder means during the sequential processing of the input sample values Zi to derive the output sample value y(n).

5. A digital filter according to claim 1 further including control circuit means operatively intercoupled with and controlling each of said first and second memory means and selector circuit means responsive to said control circuit means and selectively controlling the sequence of operation of the first adder means, the second adder means and the third adder means to produce the output sample y(n).

6. A digital filter according to claim 1 further including third memory means responsive to the outputs of said first, second and third adder means respectively for sequentially receiving and temporarily storing the resultant outputs from each of said adder means and thereafter supplying a stored interim output to the next successive adder means during the sequential processing of the input sample values Zi to derive the output sample value y(n).

7. A digital filter according to claim 1 further including third memory means responsive to the outputs of said first, second and third adder means respectively for sequentially receiving and temporarily storing the resultant outputs from each of said adder means and thereafter supplying a stored interim output to the next successive adder means during the sequential processing of the input sample values Zi, control circuit means operatively intercoupled with and controlling each of said first, second and third memory means respectively and selector circuit means responsive to the output from said third memory means and controlled by said control circuit means for selectively controlling the sequency of operation of the first, second and third adder means respectively to thereby produce the output sample y(n).

8. The digital filter according to claim 7 which further includes a feedback path which applies the output y(n) of said third adder means back to the input of said first memory means along with said sample values.

9. A method of digitally filtering an input sample signal having 2N sample values Zi exptessed by binary codes in a digital filter employing memories, shifters and adders wherein an output sample signal y(n) obtained from said filtering is expressed by the equation:

$$y(n) = \sum_{i=0}^{2N-1} Ai \cdot Zi = \sum_{i=0}^{2N-1} \left( \sum_{j=1}^{K} aij \cdot 2^{Mo-jM} \right) Zi^*$$

-continued $$= \sum_{l=0}^{2^M-1} \left( \sum_{j=1}^{K} S_{jl} \cdot 2^{Mo-jM} \right) l$$

$$= \sum_{l=0}^{2^M-1} S_l \cdot l = \sum_{m=1}^{2^M-1} \widetilde{Sm}$$

where the magnitude of $$Ai = \sum_{j=1}^{K} aij \cdot 2^{Mo-jM}, \ Zi^*$$

represents a product of a sign of Ai and Zi, aij represents a partial coefficient obtained by dividing Ai with k, k is the number of groups of partial bits each including M bits, l is an integer between O and $2^M - 1$, $S_{jl}$ represents a total sum of Zi* corresponding to $$aij = l \text{ for } (i = 0, 1, 2 \cdot 2N - 1),$$

$$S_l = \sum_{j=1}^{K} S_{jl} \cdot 2^{Mo-jM}, m = 1, 2, \ldots 2^{m-1}$$

$$\text{and } \widetilde{Sm} = \sum_{l=m}^{2^M-1} S_l;$$

said method comprising:
  storing in a first memory continuous 2N sample values Zi;
  storing in a second memory partial coefficients aij (j<k) which are obtained by dividing each coefficient Ai with k and the sign of Ai;
  combining the sample value Zi from the first memory with the partial coefficients aij from the second memory to derive a total sum signal $S_{jl}$ of the sample values to l=aij;
  shifting the output sum signal $S_{jl}$ by $2^{Mo-jM}$ where Mo and M are positive integers;
  cumulatively adding k times the output $2^{Mo-jM} \cdot S_{jl}$ from the shifting operation to derive a first interim output given by $$\sum_{j=1}^{K} S_{jl} \cdot 2^{Mo-jM} = S_l;$$

cumulatively adding ($2^M - 1 - m$) times the interim output $S_l$ to obtain $$\sum_{l=m}^{2^M-1} S_l = \widetilde{S_m};$$

and
  cumulatively adding ($2^M - 2$) times the second interim output to derive the desired output y(n).

10. A method of digitally filtering according to claim 9 further including feeding back the output y(n) to the input of the first memory along with the continuous 2N sample values Zi.

11. A method of digitally filtering according to claim 1 further comprising temporarily storing in a third memory each interim value output signal prior to its processing by the next cumulatively adding operation.

12. A method of digitally filtering according to claim 11 further including feeding back the output y(n) to the input of the first memory along with the continuous 2N sample values Zi.

* * * * *